United States Patent
Kovacs et al.

(10) Patent No.: US 6,822,880 B2
(45) Date of Patent: Nov. 23, 2004

(54) MULTILAYER THIN FILM HYDROGEN GETTER AND INTERNAL SIGNAL EMI SHIELD FOR COMPLEX THREE DIMENSIONAL ELECTRONIC PACKAGE COMPONENTS

(75) Inventors: Alan L. Kovacs, Long Beach, CA (US); Matthew H. Peter, Los Angeles, CA (US); Kurt S. Ketola, Los Angeles, CA (US); Jacques F. Linder, Rancho Palos Verdes, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/721,717

(22) Filed: Nov. 25, 2003

(65) Prior Publication Data
US 2004/0106001 A1 Jun. 3, 2004

Related U.S. Application Data

(63) Continuation-in-part of application No. 09/965,759, filed on Sep. 28, 2001, now abandoned.

(51) Int. Cl.⁷ .......................... B32B 15/06; H01L 23/06; C23C 14/16; C23C 14/20
(52) U.S. Cl. ....................... 361/818; 257/682; 257/728; 257/729; 428/626; 428/660; 428/670; 428/938; 427/124; 427/125; 427/255.7
(58) Field of Search .................... 428/670, 660, 428/938, 626, 929; 427/124, 125, 295, 255.7; 257/700, 728, 729, 682, 723, 724; 361/600, 728, 816, 818, 829, 679; 343/700 MS

(56) References Cited

U.S. PATENT DOCUMENTS

| | | | |
|---|---|---|---|
| 5,094,927 A | | 3/1992 | Baucke et al. |
| 5,218,373 A | * | 6/1993 | Heckaman et al. ......... 343/786 |
| 6,002,147 A | * | 12/1999 | Iovdalsky et al. .......... 257/276 |
| 6,057,599 A | * | 5/2000 | Iovdalsky et al. .......... 257/728 |
| 6,110,808 A | | 8/2000 | Saito |
| 6,294,827 B1 | * | 9/2001 | Iovdalsky et al. .......... 257/678 |
| 6,423,575 B1 | | 7/2002 | Tran et al. |
| 6,476,463 B1 | * | 11/2002 | Kaneko et al. ............. 257/660 |
| 2002/0100985 A1 | | 8/2002 | Shah et al. |
| 2004/0021156 A1 | * | 2/2004 | Asano et al. ................ 257/222 |

FOREIGN PATENT DOCUMENTS

| | | |
|---|---|---|
| DE | 100 49 556 A1 | 6/2001 |
| EP | 0 837 502 A2 | 4/1998 |
| JP | 2 049 452 | 2/1990 |
| JP | 4 151 858 | 5/1992 |
| JP | 08 250 615 A | 9/1996 |
| JP | 2001-168240 | 6/2001 |

OTHER PUBLICATIONS

Jackson, John David, "Classical Electrodynamics", 2nd Ed., John Wiley & Sons, New York, 1975, p. 298.

* cited by examiner

Primary Examiner—John J. Zimmerman
(74) Attorney, Agent, or Firm—John E. Gunther; Leonard A. Alkov; William C. Schubert

(57) ABSTRACT

A thin film hydrogen getter and EMI shielding are provided for protecting GaAs circuitry sealed in an hermetic package. The thin film getter comprises a multilayer metal film that is deposited by vacuum evaporation techniques onto a conductive metal, such as aluminum or copper, that serves as the EMI shielding. The conductive layer is first formed on an interior surface. The multilayer hydrogen getter film comprises (1) a titanium film and (2) a palladium film that is deposited on the titanium film. Both the titanium and the palladium are deposited during the same coating process run, thereby preventing the titanium from being oxidized. The palladium continues to prevent the titanium from being oxidized once the getter is exposed to the atmosphere. However, hydrogen is easily able to diffuse through the palladium into the titanium where it is chemically bound up, since palladium is highly permeable to hydrogen.

20 Claims, 6 Drawing Sheets

MULTILAYER THIN FILM HYDROGEN GETTER AND INTERNAL SIGNAL EMI SHIELD FOR COMPLEX THREE DIMENSIONAL ELECTRONIC PACKAGE COMPONENTS

CROSS-REFERENCE TO RELATED APPLICATIONS

The present application is a continuation-in-part application of application Ser. No. 09/965,759, filed Sep. 28, 2001, now abandoned.

The present application is related to application Ser. No. 10/210,240, filed on Aug. 1, 2002, and entitled "Dielectric Interconnect Frame Incorporating EMI Shield and Hydrogen Absorber for Tile T/R Modules", the contents of which are incorporated herein by reference. That application is directed to dielectric interconnect frames, used in GaAs hermetically-sealed packaging.

TECHNICAL FIELD

The present invention relates to packaging of gallium arsenide (GaAs) integrated circuits, and, more particularly, to a hydrogen getter for chemically binding up hydrogen evolved from packaging materials.

BACKGROUND ART

Gallium arsenide (GaAs) integrated circuits which are hermetically packaged will suffer from reduced performance and reliability if the hydrogen that is evolved from the packaging materials is allowed to diffuse into the GaAs devices. By "packaging materials" is meant base materials, such as iron-nickel alloys (housing, cover, etc.), platings, such as nickel and gold plating (both electroless and electrolytic, used for conductive traces and surfaces as well as for corrosion-resistant surface treatments), and organic materials, such as epoxy for sealing or die attachment. Hydrogen concentrations as low as 500 ppm have been demonstrated to decrease the mean time to failure. A prior art solution to this problem of hydrogen poisoning is to insert a material into the package which chemically binds up the hydrogen. This material is typically referred to as a hydrogen getter.

In many critical applications, reducing the size, weight, and cost of the hydrogen getter is crucial to improving the product line. In some applications, mainly those involving organic electronic packaging material, some type of metallization is required to provide a ground path/EMI (electro-magnetic interference) shield, due to the relatively high resistivity of the organic material.

Alpha Metals (Jersey City, N.J.) produces a hydrogen getter which incorporates particles of a gettering material into a silicone matrix sheet. There are several disadvantages to this getter: (1) in order to provide enough hydrogen absorption capacity in a package, a significant volume of silicone getter must be used; (2) Residual Gas Analysis (RGA), used to determine internal contaminants within a hermetic package, can return false results related to moisture content when the silicone product is used; (3) silicone oil migration within the package has been observed, which makes re-work of the assembly impossible, due to the inability to re-solder joints wetted with the silicone oil; (4) there is added cost and complexity associated with having to bond the silicone getter sheet to some available surface; and (5) the silicone getter must first be vacuum baked at 150° C. for greater than 16 hours before it can be inserted into the package. This adds to the manufacturing time and cost.

Several years ago, titanium foils coated with vacuum-deposited palladium were investigated as potential hydrogen getters by Hughes Aircraft. These getters did not provide good reliable gettering capability, most likely due to the oxide layer present on the titanium foil. A titanium foil would also have the added cost of welding to the package lid.

Packaging density has increased four fold in the last six years of transmit/receive (T/R) module development; such modules employ interconnect frames. Traditional 2-D packaging solutions typically exhibit large planar areas, such as the cover, that are suitable for mounting commercially-available hydrogen getter technology. However, the cover in a 3-D package is now an electrically functional component and not suitable for location of a hydrogen-gettering material.

Thus, there is a need for a hydrogen getter that will provide significant improvement in the size, weight, cost, flexibility, and ease of insertion while at the same time achieving excellent hydrogen gettering capability both in terms of the speed at which the getter absorbs hydrogen and the overall amount of hydrogen that can be absorbed. In addition, a means of designing the film to meet the service life of the product is also necessary, not only from a total absorption but from a film integrity perspective. The reaction degradation of the film or gettering media cannot result in conductive particle generation, which would present functional risk to the packaged electronics. There is also a need for a ground/EMI shield where the electronics package material comprises an organic polymer.

DISCLOSURE OF INVENTION

In accordance with a first aspect of the present invention, a combination is provided of (a) a thin film hydrogen getter for gettering hydrogen evolved from packaging materials employed in a device comprising hermetically-sealed GaAs integrated circuitry employing at least one interconnect frame and (b) an EMI shield for shielding internal signals. By "thin film" is meant herein a metal film that is vacuum-deposited, such as by sputtering or evaporation.

The thin film getter and EMI shield of the present invention comprises a multilayer metal film that is vacuum-deposited. The multilayer film comprises:

(a) a layer of an electrically conductive metal for providing electro-magnetic interference shielding, formed on surfaces of the interconnect frame;

(b) a layer of titanium for absorbing and chemically binding up the hydrogen, formed on the layer of electrically conductive metal; and (c) a layer of palladium for preventing oxidation of the titanium, but permeable to the hydrogen, formed on the layer of titanium.

A method of fabricating the combination is also provided. The method comprises:

(a) forming the layer of the electrically conductive metal on surfaces of the interconnect frame;

(b) vacuum-depositing the layer of titanium on the layer of electrically conductive metal; and (c) vacuum-depositing the layer of palladium on the layer of titanium.

Both the titanium and the palladium are deposited during the same coating process (vacuum deposition) run, thereby preventing the titanium from being oxidized. The palladium continues to prevent the titanium from being oxidized once the getter is exposed to the atmosphere. However, hydrogen is easily able to diffuse through the palladium into the titanium where it is chemically bound up, since palladium is highly permeable to hydrogen. The present inventors have demonstrated high hydrogen absorption rates and hydrogen capacities for thin film getters deposited onto plastic test parts.

Finally, in accordance with another aspect of the present invention, a hydrogen getter is provided for gettering hydrogen evolved from packaging materials employed in a transmit/receive module configured to transmit and receive electromagnetic radiation over a predetermined portion of the electromagnetic spectrum. The transmit/receive module comprises a least one frame component formed as a single piece from a synthetic resin dielectric material. The frame component is configured to support a plurality of electrical connectors. The hydrogen getter comprises a thin film coating on at least one surface of the frame component. The thin film coating comprises (a) the layer of titanium and (b) the layer of palladium, as described above.

The thin film getter has several advantages: (1) Since the thin film getter has a hydrogen capacity per unit volume which is 25 times higher than the silicone getter, then the thin film getter will occupy an extremely small volume; (2) It is flexible in its application, since any convenient substrate that is going into the hermetic package can be coated with the thin film getter; (3) There is no cost or time associated with welding or bonding the thin film getter into the package as there is with foil or silicone getters; (4) The thin film getters don't require a lengthy vacuum bakeout prior to insertion; a vacuum bakeout of 85° C. for 2 to 3 hours is sufficient; and (5) There is no silicone in the thin film getter, which prevents contamination.

In addition to the advantages that the thin film getter provides over the other getters, as described in greater detail below, the thin film getter is also able to absorb hydrogen effectively at temperatures as low as 0° C.

The ground/EMI shield can be used to enhance circuit performance. The ground/EMI shield film component allows organic materials to be used within microwave modules, thereby providing cost benefits through reduced weight. The conductivity of the film allows its use in any type of dielectric package, thereby providing EMI and hydrogen protection for GaAs circuitry.

BEST MODES FOR CARRYING OUT THE INVENTION

Figure 1:
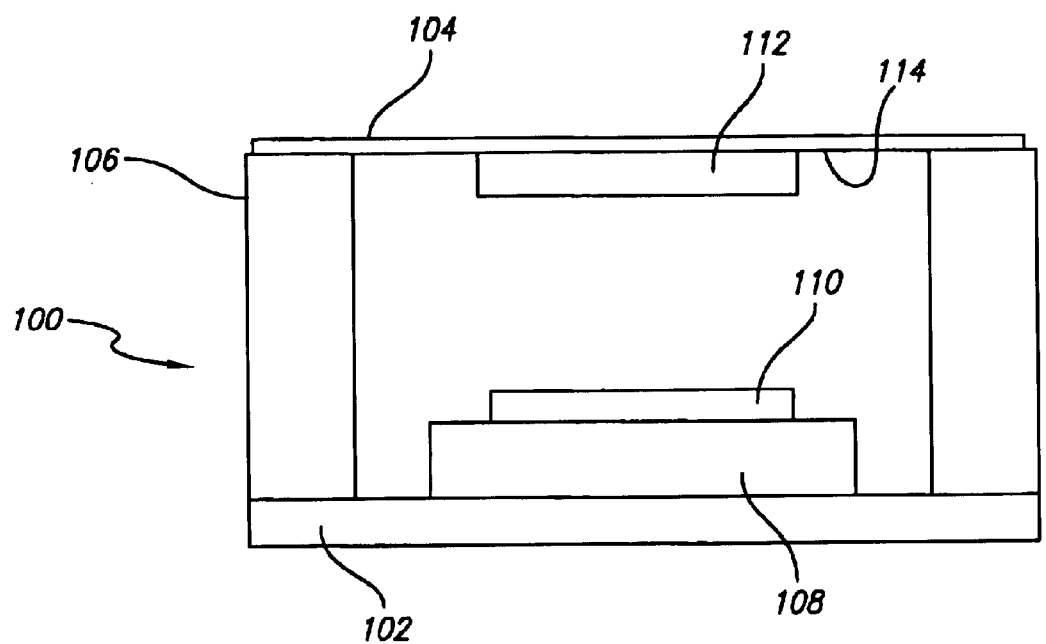
FIG. 1 is a cross-sectional view of a conventional two-dimensional module, which includes a cover that is an ideal location for RF absorber and hydrogen absorbers.

FIG. 1 depicts a conventional two-dimensional (2-D) module, which includes a cover that is an ideal location for an RF absorber material and a hydrogen absorber. The module 100 comprises a base 102, a cover 104 and a sealing ring 106 that seals the base to the cover. Inside the module 100, a substrate 108 is provided that supports a device 110, e.g., a Monolithic Microwave Integrated Circuit (MMIC) type, with a gallium arsenide (GaAs) semiconductor. On the inside of the cover 104 is provided a hydrogen gettering structure 112, typically comprising a titanium layer and a palladium layer thereon. The inside of the cover 104 may also include an RF absorbing material (not shown).

FIG. 1 amplifies the difference between conventional 2-D packaging and 3-D electronics with respect to the application of the prior art. It will be noted that the prior art is form fit with conventional 2-D packages. Since the cover 104 is simply used as a mechanism to close the package volume, it performs no electrical functionality. The 2-D planar layout of the substrate 108 with electrical devices 102 is large in comparison with the area required in a stacked 3-D approach (illustrated below). The volume of the package and in particularly the area of the cover increases rapidly as a function of the number of devices on the substrate. Therefore, the conventional 2-D approach provides ample area for the attachment of RF shielding as well as prior art hydrogen getters.

The traditional package cover flat 114 is ideally suited to prior art getter solutions. As the device count in the package increases, the substrate 108 becomes larger, and thus the cover 104 increases in size. Therefore, as complexity increases via increased dies, the area for the getter 112 to protect the devices 110 increases.

Figure 2:
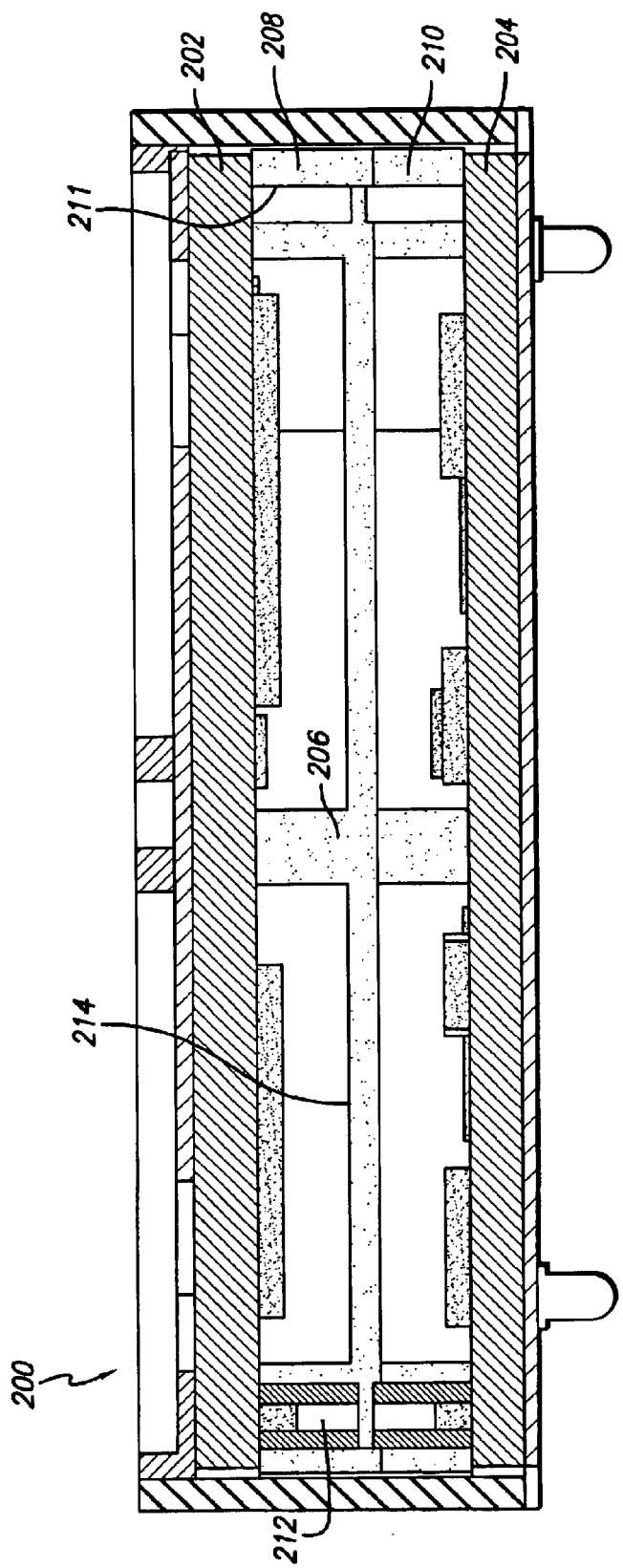
FIG. 2 is a schematic cross sectional illustration of a portion of a three-dimensional T/R module incorporating an interconnect frame that employs the hydrogen absorber and EMI shield of the present invention.

FIG. 2 schematically illustrates essential components of a three-dimensional (3-D) transmit/receive (TIR) module 200 having an interconnect frame. The T/R module 200 comprises a pair of T/R circuit components 202, 204, and an interconnect frame 206 disposed between the T/R circuit components. Each of the T/R circuit components 202, 204 can be, e.g., a Monolithic Microwave Integrated Circuit (MMIC) type, with a gallium arsenide (GaAs) semiconductor. The interconnect frame 206 is formed as more fully disclosed in above-referenced co-pending application Ser. No. 10/210,240, filed on Aug. 1, 2002, and includes a plurality of electrical connectors 212 which interconnect the T/R circuit components 102, 104. In a 3-D tile T/R module, there may be additional circuit components, and additional electrical connectors interconnecting those circuit components, or providing input/output (I/O) connections for the module, as will be apparent to those in the art.

The interconnect frame 206 is formed by a pair of frame components 208, 210 (see also FIGS. 3 and 4), each of which formed as a single piece (e.g., as a molded article) from a synthetic resin dielectric material. Preferably, each frame component is injection molded from a synthetic resin sold under the registered mark VECTRA® (which is registered to Celanese Corporation, New York, N.Y.), and which resin is capable of being injection molded, extruded, thermoformed and machined for various high performance plastic applications. For the current embodiment, molded materials can be selected for di-electric constant and loss tangent, based on the particular EMI application. The frame components have less weight than metal frame components, and are more cost effective to produce than metal frame components. Additionally, by forming the frame components as single piece structures, the number of parts required to form an interconnect frame for a T/R tile module is significantly reduced, in comparison to the number of parts required to form a metal interconnect frame for such a module.

Figure 3:
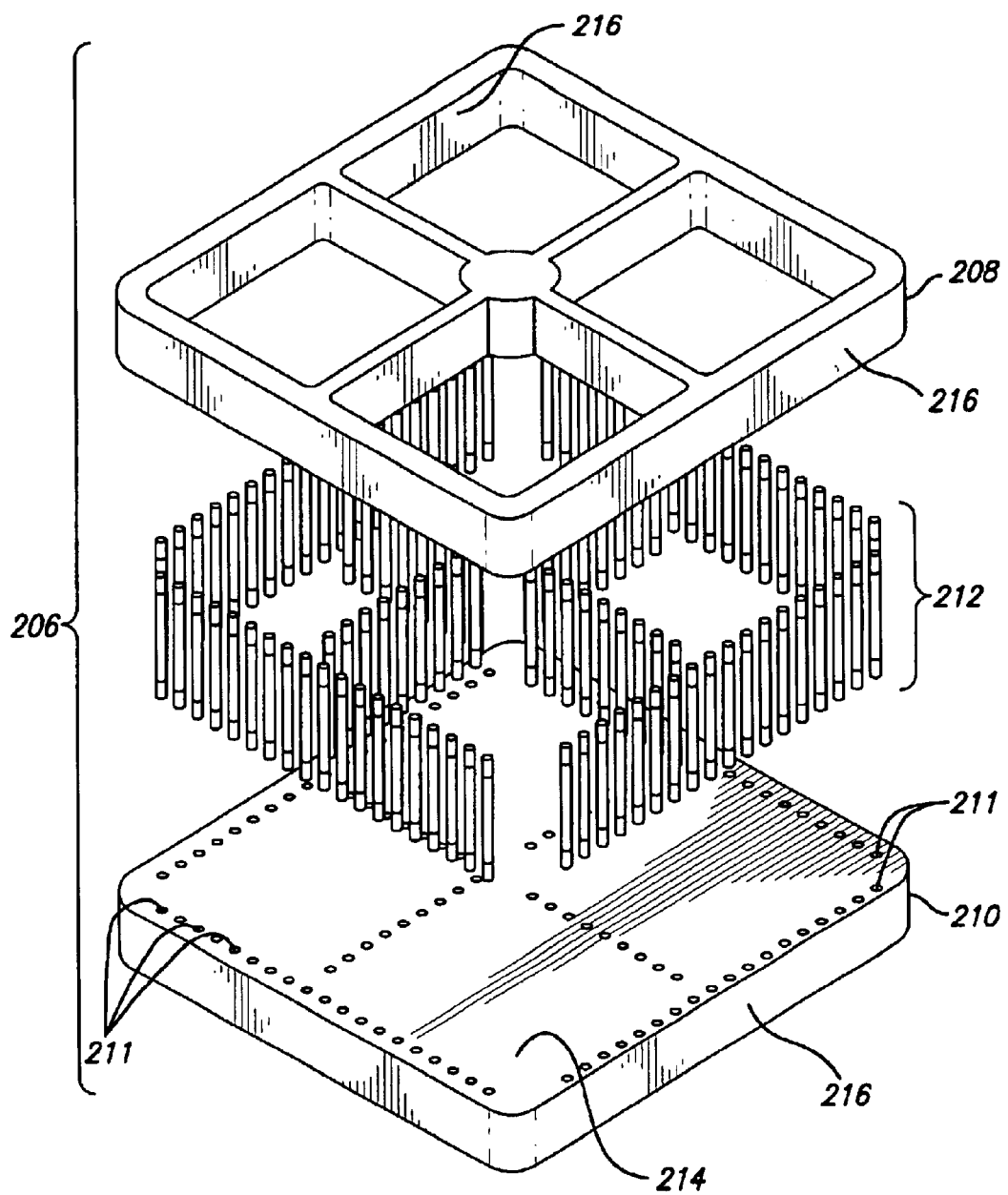
FIG. 3 is an exploded view of some of the components forming the interconnect frame of FIG. 2.

Each of the frame components 208, 210 is configured to support a respective portion of a plurality of the electrical connectors 212 which extend between the T/R circuit components 202, 204 (FIG. 3). Each frame component 208, 210 includes a plurality of apertures 211 (FIGS. 3 and 4), each of which is preferably cylindrical, and each of which is configured to support a respective portion of a single electrical connector 212. When the pair of frame components 208, 210 supports a plurality of electrical connectors 212, the electrical connectors extend through the pair of frame components, and engage respective portions of the T/R circuit components 202, 204. Compliant conductive contact concepts, known to those in the art as Pogo Pins and Fuzz Buttons, are used to provide compliant connections between the electrical conductors and the T/R circuit components.

Each of the frame components 208, 210 has a thin film coating 10 or 10' (FIGS. 4 and 5) configured to provide either hydrogen gettering (film 10) or a combination of hydrogen gettering and EMI shielding (film 10') when the frame structure is incorporated into a T/R tile module. The EMI shield is provided between multiple channels within a single module and between transmit and receive paths within a single channel.

Unlike the situation with the prior art 2-D packaging, the available surface area 214 (FIGS. 2 and 3) is not proportional to the device count. The surface area 214 is significantly less than the prior art 2-D packaging approach for mounting a hydrogen absorber. On the other hand, in the 3-D approach, all horizontal surfaces 214 and vertical surfaces 216 (FIG. 3) can be employed as the hydrogen getter surface. As a matter of course, both the hydrogen gettering and EMI shielding films 10' will be deposited on the surfaces 214, 216.

Figure 5A:
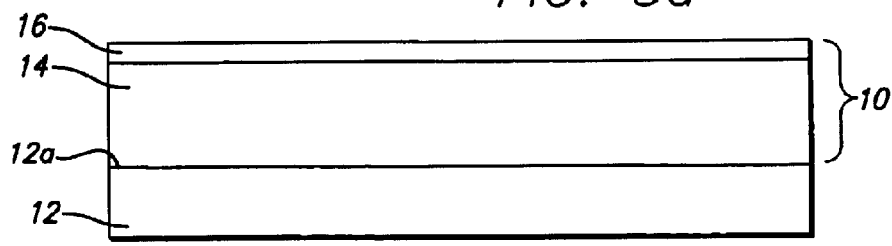
FIG. 5a is a cross-sectional view of a thin film hydrogen structure in accordance with a first embodiment of the present invention.
Figure 5B:
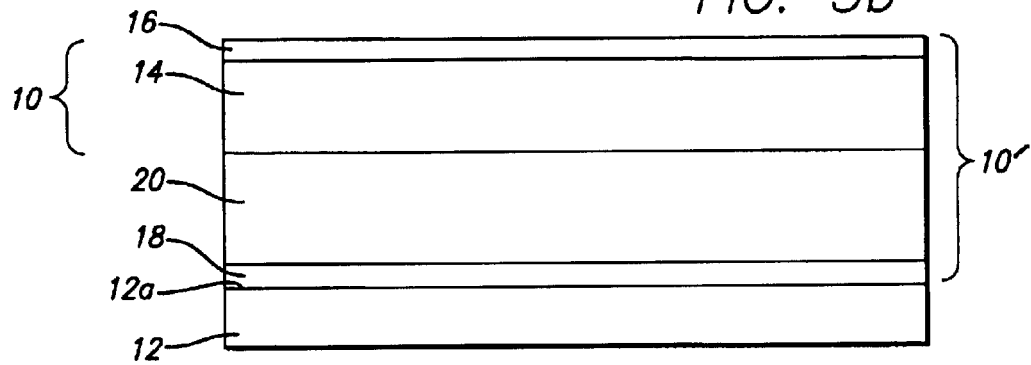
FIG. 5b is a cross-sectional view of a thin film hydrogen structure in accordance with a second embodiment of the present invention.

In one embodiment, the thin film hydrogen getter 10 of the present invention consists of a vacuum-deposited multilayer film as shown in FIG. 5a, deposited on top of a surface 12a of substrate 12. It will be understood that the substrate 12 shown in FIGS. 5a and 5b is the same as the surface of the frame components 208, 210. A titanium (Ti) layer 14 is first vacuum-deposited, followed by a palladium (Pd) layer 16.

The titanium layer 14 has a thickness that is related to the expected generation of hydrogen over the lifetime of the package and the total area of the thin film, plus some safety margin. For example, for an expected hydrogen generation of about 75 Torr·cm$^3$ from the package, only 0.56 mg of titanium would be required to absorb this amount of hydrogen. Factoring in a safety factor of 10, the required amount of titanium would still only be 5.6 mg.

The thickness of the palladium layer 16 must be thick enough to avoid pinholes (which would allow unwanted oxidation of the underlying titanium layer), but not so thick as to adversely affect the diffusion of hydrogen therethrough. Consistent with these considerations, the thickness of the palladium layer 16 is in the range of about 2,000 to 6,000 Å.

Both the Ti and Pd layers 14, 16 are deposited during the same processing run at a vacuum of about 10$^{-6}$ Torr. The substrate 12 comprises a dielectric material, which may be used in microelectronic packages containing GaAs devices. Specifically, the substrate 12 is a frame structure inside the package, and surrounds the active GaAs device.

Figure 4:
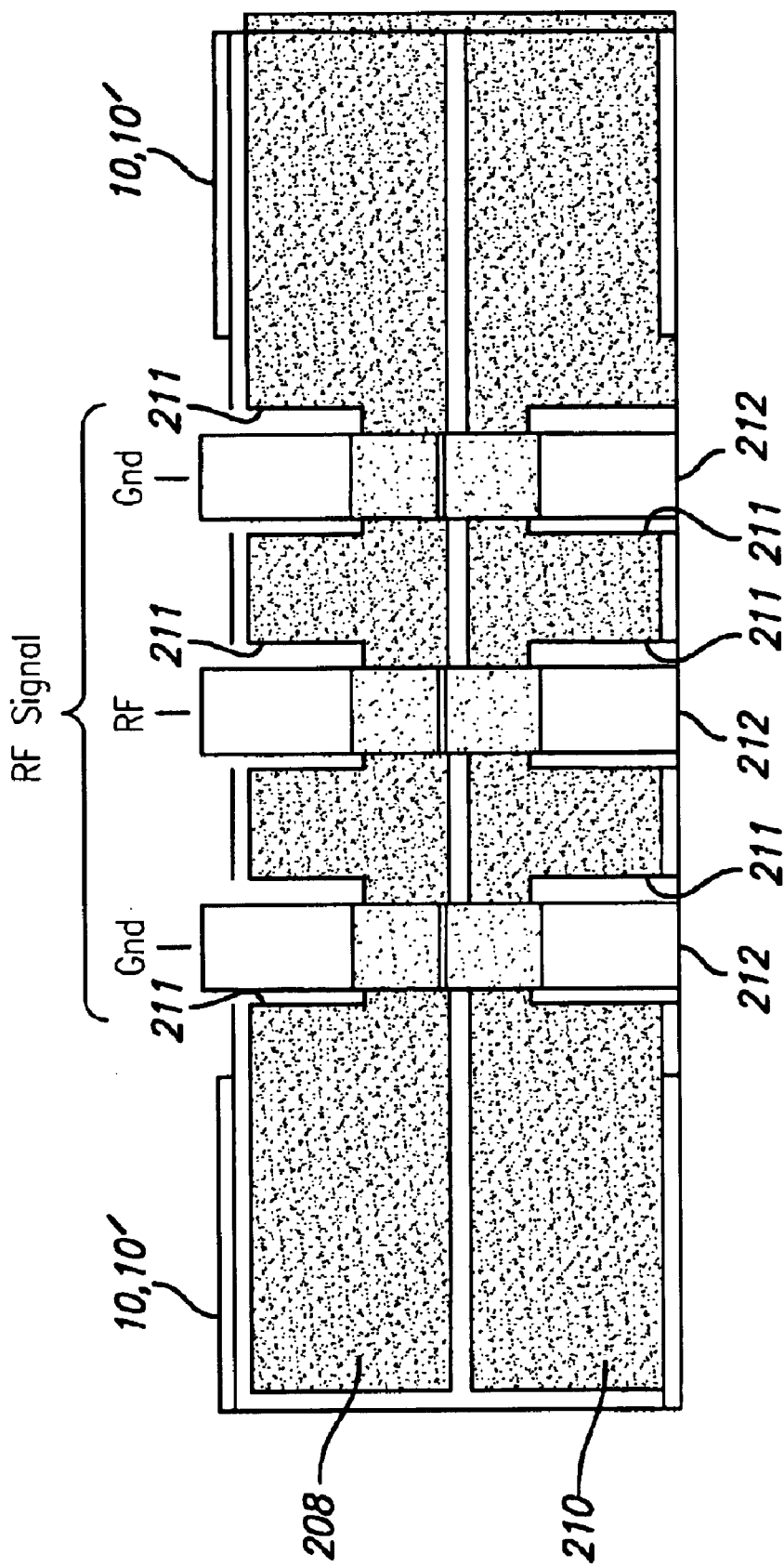
FIG. 4 is a schematic illustration of a portion of the interconnect frame with several of the electrical connectors supported by the frame, along with the thin film getter/EMI shield of the present invention.

As demonstrated in FIGS. 2–4, the 3-D package solution is severely limited in available planar areas to incorporate hydrogen getters related to any of the approaches shown in the prior art. The available flat surfaces in the frame structure 206 are not large enough to mount sufficient gettering materials of the prior art to support low hydrogen levels. In addition, this valuable real estate is also the plane on which an RF absorber would be located. The RF absorber comprises a material used to eliminate unwanted spurious signals propagating from device to device. Depending on the device type selected, the RF absorber may or not be necessary; however, that is typically assessed during the final stages of product development. Even if the area was sufficient to locate the required hydrogen getter volume, it is impossible to know if this area would be available until well past the completion of the physical design. Therefore, one could not complete the physical design of a product to meet all lifetime requirements until the actual product was built and electrically tested, which is an unacceptable risk in the design phase of a product development task.

The design rule for estimating the total amount of titanium required for a particular package application is based on the average atomic ratio of hydrogen to titanium, X. For a conservative estimate, the concentration should not exceed X=0.1 during the lifetime of the package. This concentration de-rating factor is considered imperative to insure the integrity of the film structure over the environmental exposures required of a high reliability product. Higher concentration allowances present the risk of metallic particulate generation over the lifetime of the product, since the film structure will crack and subsequently sloughs off into the package volume.

The theoretical hydrogen capacity per unit mass of titanium is 388 Torr·cm$^3$·mg$^{-1}$, but the effective capacity per unit mass that is measured is about 134 Torr·cm$^3$·mg$^{-1}$, which, again being conservative, is the value used herein to calculate the amount of titanium required. The requirement can be written as:

$$M_{Ti} > \frac{20 \, Q_{eff} T_L}{134 \text{ Torr·cm}^3 \text{·mg}^{-1}}$$

where $M_{Ti}$ is the mass of titanium, $Q_{eff}$ is the rate of hydrogen production from the packaging materials, and $T_L$ is the required lifetime of the device. Assuming that $T_L$=20 years and $Q_{eff}$ is 2.2×10$^{-7}$ Torr·cm$^3$·sec$^{-1}$, then $M_{Ti}$ must be greater than 20.7 mg. Since the density of Ti is 4.51 g·cm$^{-3}$, this means that the volume occupied by the titanium must be greater than 4.59×10$^{-3}$ cm$^3$. If the surface area is 20 cm$^2$, for example, then the titanium thickness must be at least 22,950 Å.

The variable $T_L$ is directed to the lifetime of the device. By "lifetime" is meant the required lifetime, or the lifetime specified by the customer for whom the packaged GaAs device is to be fabricated. Once that information is provided, then that value for $T_L$ is inserted into the equation. No determination or experimentation is required to be performed to determine the lifetime of the device, since it is a lifetime that is simply required, or specified. This is logical, since the amount of titanium to be used in gettering hydrogen must be designed to last at least for the expected lifetime of the device.

The thin film hydrogen getter 10 has the following features:
(1) The relatively thick Ti layer 14 absorbs and chemically binds up hydrogen.
(2) The Pd layer 16 prevents oxidation of Ti 14, but allows hydrogen to diffuse through to the Ti layer.

In a preferred embodiment, the thin film hydrogen getter/EMI shield 10' of the present invention consists of a vacuum-deposited multilayer film as shown in FIG. 5b, deposited on top of the surface 12a of substrate 12. The EMI film comprises a thin (100 to 250 Å) electrically conductive metal, for example, a Ti adhesion layer 18 followed by an aluminum 20, 100 to 200 microinch in thickness, thereby providing 5 to 6 skin depths thickness at 10 GHz. As above, the getter portion comprises the Ti layer 14, followed by the palladium Pd layer 16. Again, the titanium layer 14 has a thickness of about 40 to 80 microinch, while the palladium layer 16 has a thickness of about 8 microinch. All of the four layers 14, 16, 18, 20 are deposited during the same processing run at a vacuum of about $10^{-6}$ Torr. Alternatively, the Ti adhesion layer 18 may be omitted, and instead, a copper or nickel layer, deposited by electroless deposition, may be deposited directly on the dielectric substrate 12. Here, the substrate 12 comprises an organic polymeric dielectric material, which may be used in microelectronic packages containing GaAs devices. Surrounding the GaAs device with the substrate 12 frame 206, which is almost completely coated with the combination 10' EMI film 20 and hydrogen getter film 10, permits shielding internal signals, in addition to gettering hydrogen.

"Skin depth", as used herein, is a well known term of art in EMI shielding. The term "skin depth" or "penetration depth" is the distance into a conductor that an electromagnetic wave is damped to 1/e of its initial amplitude. As an example, copper has a skin depth $\delta$ is 0.85 cm for frequencies of 60 cps and $0.71 \times 10^{-3}$ cm for 100 MHz (Mc/sec). For non-magnetic material, the skin depth $\delta$ (in microns) is approximately $1.6(\rho/f)^{1/2}$, where $\rho$ is the resistivity in microohm cm and f is the frequency in GHz (1 GHz=$1 \times 10^9$ Hz). Thus, the skin depth is a measure of how deep below a surface EMI waves penetrate. For example, in the case of aluminum, a thickness of 100 to 200 microinch provides 5 to 6 skin depths thickness at 10 GHz.

The thin film hydrogen getter/EMI shield 10' has the same features as disclosed above for the thin film hydrogen getter 10, and in addition has the following feature:
(3) Aluminum or copper provides 5 to 6 skin depths of wave propagation media for high performance EMI shielding.

Hydrogen absorption of the thin film getter has been extensively tested. Thin film getters with Ti thicknesses of 40 and 80 microinches have been investigated to determine hydrogen pumping rate, total hydrogen absorption, as well as area and volumetric effects on the gettering properties.

Figure 6:
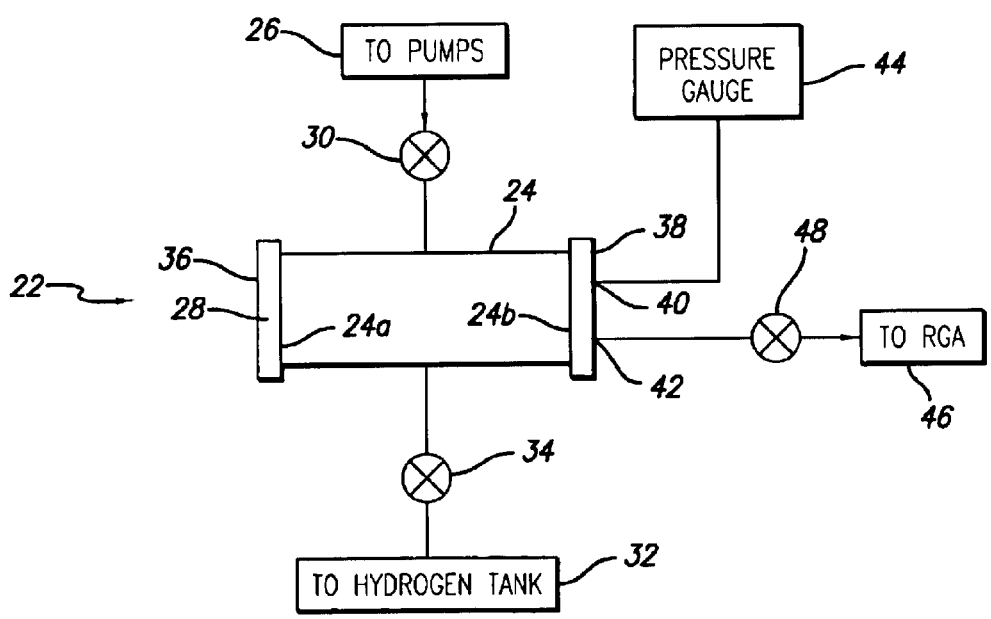
FIG. 6 is a schematic view of a test chamber for measurement of gettering properties.

FIG. 6 shows in schematic form the gettering test system 22 that was designed and built to measure the gettering speed and capacity of the multilayer getter films 10, 10' that were fabricated in accordance with the teachings herein. The gettering chamber 24 can be pumped out to the $1 \times 10^{-6}$ Torr region by a diffusion pump 26 and can be heated by heating tape (not shown) that is wrapped around the outside of the chamber. The getter sample is admitted to the chamber 24 from the port 28 on the left side of the chamber and then the chamber is pumped down to the $1 \times 10^{-6}$ Torr region and the temperature is elevated to ~85° C. for at least 3 hours. Then the chamber 24 is allowed to come back to room temperature and the valve 30 to the diffusion pump 26 is closed.

Hydrogen 32 is added to the chamber 24 in doses up to a typical pressure of about 1.0 Torr and then the hydrogen fill line valve 34 is shut. Once this valve 34 is shut, then the pressure begins to drop immediately due to the gettering effect. The pressure is measured as a function of time. Once the pressure has stabilized in the milliTorr region, another dose of hydrogen is once again added to the chamber 24. This process is continued until the getter 10 is saturated and is no longer absorbing hydrogen.

The chamber 24 is advantageously a stainless steel cylinder, with a conflat blank-off 36 at one end 24a. The conflat blank-off 36 is also stainless steel, provided with a copper gasket (not shown), and permits access to the sample (not shown) in the chamber 24, while sealing the chamber during operation. The chamber 24 is sealed at the opposite end 24b with a plate 38, fitted with openings 40, 42 to which a pressure gauge 44 and a residual gas analyzer (RGA) 46, through valve 48, are attached, respectively. The pressure gauge 44 permits monitoring of pressure inside the chamber 24, while the RGA permits monitoring of hydrogen concentration levels. The total internal volume of the chamber 24 is about 225 cm$^3$.

Figure 7:
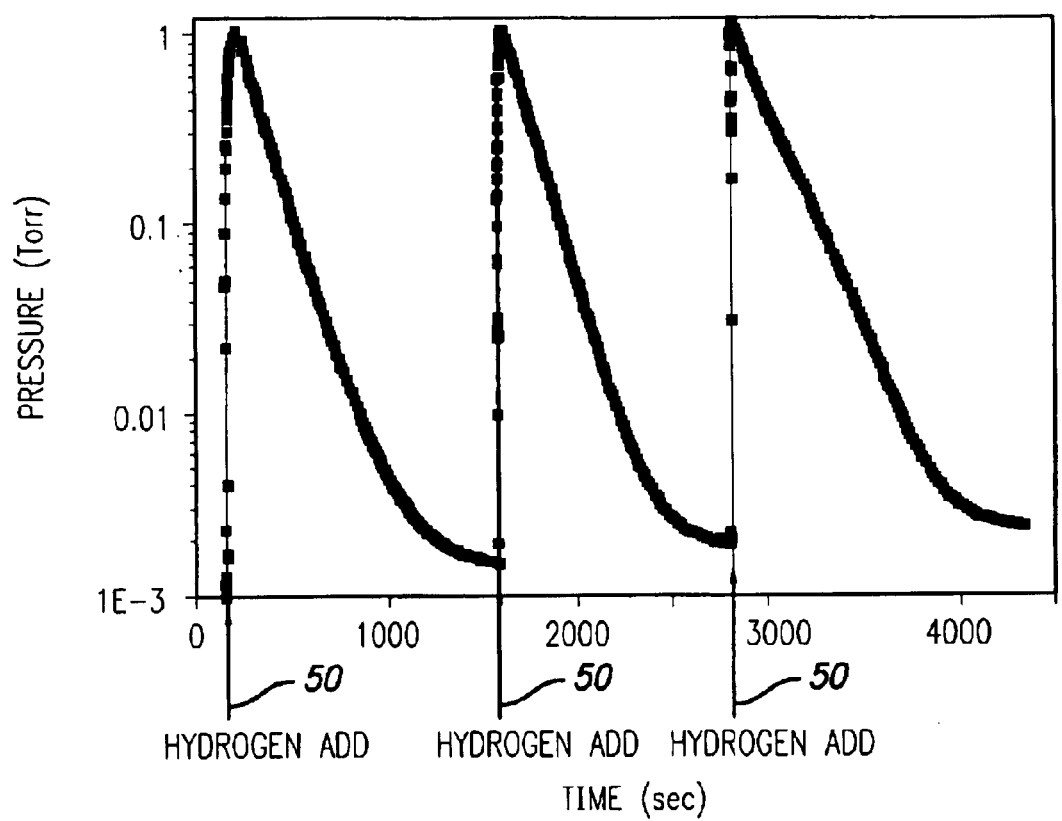
FIG. 7, on coordinates of pressure (in Torr) and time (in seconds), is a plot of characteristic gettering data.

FIG. 7 shows typical test data. The pressure in the test chamber 24 is plotted as a function of time. The vertical arrows 50 indicate where the hydrogen fill line valve 34 was opened to admit hydrogen to the chamber 24. It will be noted that the data falls on a line when plotted semi-logarithmically. The pressure drops exponentially due to the gettering effect of the multilayer film 10, 10' and it does so at a fast rate, dropping to 1% of its original value after only about 600 seconds. The slope of the curve after each hydrogen add is proportional to the pumping speed of the getter. Hydrogen is repeatedly added in this fashion until the pressure no longer drops.

Other Experiments:

A number of other experiments have been performed which have elucidated a number of important facts about the thin film hydrogen getters 10, 10'. These results are summarized here:
(1) Hydrogen is not released from the titanium at temperatures up to 115° C. Prior work done by others indicates that hydrogen should not desorb from titanium for temperature below 500° C.
(2) Thin film getters which use titanium have twice the effective hydrogen capacity as thin film getters which use zirconium as the active getter material.
(3) The pumping speed is proportional to getter surface area.
(4) The presence of helium and nitrogen do not impede the sorption of hydrogen by the getter.
(5) The hydrogen pumping speed S increases with temperature T according to:

$$S = S_0 e^{-E_1/k_B T}$$

where $S_0$ is the initial hydrogen pumping speed, $k_B$ is the Boltzmann constant, and $E_1$ is the activation energy, which was measured to be 0.31 eV.

SUMMARY

A multi-functional multilayer thin film hydrogen getter 10, 10' has been developed which achieves:
(1) High hydrogen pumping speeds: 0.15 cm$^3$/sec per cm$^2$ at 23° C.
(2) The hydrogen removal rate of the thin film getter 10, 10' when the hydrogen pressure is 1 Torr is $2 \times 10^{-4}$ standard cm³ of hydrogen per second, which is 1,000 times faster than worst case hydrogen evolution rate in a hermetically sealed package.

(3) The hydrogen capacity is 135 Torr·cm³ per mg of titanium which is high, since it is only necessary to absorb about 75 Torr·cm³ of H₂ over a typical package lifetime.

(4) The hydrogen pumping speed remains relatively high for temperatures down to 0° C. (the pumping speed at 0° C. is 30% of its value at room temperature).

(5) EMI shielding through incorporation of a highly conductive metallic sublayer which can be deposited on dielectric or non-dielectric packaging materials.

INDUSTRIAL APPLICABILITY

The hydrogen getter/EMI shield of the present invention is expected to find use in hermetic sealing of GaAs electronic circuit packaging.

What is claimed is:

1. A combination of (a) a hydrogen getter for gettering hydrogen evolved from packaging materials employed in a device comprising hermetically-sealed GaAs integrated circuitry employing at least one interconnect frame and (b) an EMI shield for shielding internal signals, comprising:

(a) a layer of an electrically conductive metal for providing electromagnetic interference shielding, formed on surfaces of said interconnect frame;

(b) a layer of titanium for absorbing and chemically binding up said hydrogen, formed on said layer of electrically conductive metal; and (c) a layer of palladium for preventing oxidation of said titanium, but permeable to said hydrogen, formed on said layer of titanium.

2. The combination of claim 1 wherein said titanium has a total mass larger than that given by the following equation:

$$M_{Ti} > \frac{20 \, Q_{eff} T_L}{134 \text{ Torr} \cdot \text{cm}^3 \cdot \text{mg}^{-1}}$$

where $M_{Ti}$ is the mass of titanium, $Q_{eff}$ is the rate of hydrogen production from said packaging materials, and $T_L$ is a specified lifetime of said device, and wherein said palladium has a thickness of about 2,000 to 6,000 Å.

3. The combination of claim 1 wherein said layer of said electrically conductive metal has a thickness ranging from 5 to 6 skin depths of wave propagation media.

4. The combination of claim 3 wherein said electrically conductive metal is selected from the group consisting of aluminum and copper.

5. The combination of claim 4 wherein said layer of said electrically conductive metal comprises aluminum and wherein said hydrogen getter further includes a layer of titanium for adhering said aluminum layer to said surface of said interconnect frame.

6. The combination of claim 5 wherein said adhering layer of titanium has a thickness of about 20 nm.

7. A method for fabricating a combination of (a) a hydrogen getter for gettering hydrogen evolved from packaging materials employed in a device comprising hermetically-sealed GaAs integrated circuitry employing at least one interconnect frame and (b) an EMI shielding for shielding internal signals, said method comprising:

(a) forming a layer of an electrically conductive metal for providing electromagnetic interference shielding on surfaces of said interconnect frame;

(b) vacuum-depositing a layer of titanium for absorbing and chemically binding up said hydrogen, formed on said layer of electrically conductive metal; and (c) vacuum-depositing a layer of palladium for preventing oxidation of said titanium, but permeable to said hydrogen, on said layer of titanium, said vacuum deposition of both said titanium layer and said palladium layer being done sequentially during a single coating run to thereby prevent oxidation of said titanium layer.

8. The method of claim 7 wherein said titanium has a total mass larger than that given by the following equation:

$$M_{Ti} > \frac{20 \, Q_{eff} T_L}{134 \text{ Torr} \cdot \text{cm}^3 \cdot \text{mg}^{-1}}$$

where $M_{Ti}$ is the mass of titanium, $Q_{eff}$ is the rate of hydrogen production from said interconnect frame, and $T_L$ is a specified lifetime of said device, and wherein said palladium has a thickness of about 2,000 to 6,000 Å.

9. The method of claim 7 wherein said layer of said electrically conductive metal has a thickness ranging from 5 to 6 skin depths of wave propagation media.

10. The method of claim 9 wherein said electrically conductive metal is selected from the group consisting of aluminum and copper.

11. The method of claim 10 wherein said layer of said electrically conductive metal comprises aluminum and wherein said hydrogen getter further includes a layer of titanium for adhering said aluminum layer to said surface of said interconnect frame.

12. The method of claim 11 wherein said adhering layer of titanium has a thickness of about 20 nm.

13. The method of claim 10 wherein said layer of electrically conductive material comprises copper and is electroless-deposited on said surface of said interconnect frame.

14. A hydrogen getter for gettering hydrogen evolved from packaging materials employed in a transmit/receive module configured to transmit and receive electromagnetic radiation over a predetermined portion of the electromagnetic spectrum, said transmit/receive module comprising a least one frame component formed as a single piece from a synthetic resin dielectric material, said frame component configured to support a plurality of electrical connectors, said hydrogen getter comprising a thin film coating on at least one surface of said frame component, said thin film coating comprising:

(a) a layer of titanium for absorbing and chemically binding up said hydrogen, formed on said at least one surface; and (b) a layer of palladium for preventing oxidation of said titanium, but permeable to said hydrogen, formed on said layer of titanium.

15. The hydrogen getter of claim 14 wherein said titanium has a total mass larger than that given by the following equation:

$$M_{Ti} > \frac{20 \, Q_{eff} T_L}{134 \text{ Torr} \cdot \text{cm}^3 \cdot \text{mg}^{-1}}$$

where $M_{Ti}$ is the mass of titanium, $Q_{eff}$ is the rate of hydrogen production from said packaging materials, and $T_L$ is a specified lifetime of said transmit/receive module, and wherein said palladium has a thickness of about 2,000 to 6,000 Å.

16. The hydrogen getter of claim 14 further including a layer of an electrically conductive metal for providing electromagnetic interference shielding, formed between said layer of titanium and said surface of said frame component.

17. The hydrogen getter of claim 16 wherein said layer of said electrically conductive metal has a thickness ranging from 5 to 6 skin depths of wave propagation media.

18. The hydrogen getter of claim 17 wherein said electrically conductive metal is selected from the group consisting of aluminum and copper.

19. The hydrogen getter of claim 18 wherein said layer of said electrically conductive metal comprises aluminum and wherein said hydrogen getter further includes a layer of titanium for adhering said aluminum layer to said surface of said frame component.

20. The hydrogen getter of claim 19 wherein said adhering layer of titanium has a thickness of about 20 nm.

* * * * *